`US007851695B2`

(12) United States Patent
Sawada et al.

(10) Patent No.: US 7,851,695 B2
(45) Date of Patent: Dec. 14, 2010

(54) STACKED-TYPE PHOTOELECTRIC CONVERSION DEVICE

(75) Inventors: Toru Sawada, Uji (JP); Yuko Tawada, Otsu (JP); Takashi Suezaki, Moriyama (JP); Kenji Yamamoto, Kobe (JP)

(73) Assignee: Kaneka Corporation, Osaka-shi (JP)

( * ) Notice: Subject to any disclaimer, the term of this patent is extended or adjusted under 35 U.S.C. 154(b) by 164 days.

(21) Appl. No.: 12/087,067

(22) PCT Filed: Dec. 19, 2006

(86) PCT No.: PCT/JP2006/325296

§ 371 (c)(1),
(2), (4) Date: Jun. 25, 2008

(87) PCT Pub. No.: WO2007/074683

PCT Pub. Date: Jul. 5, 2007

(65) Prior Publication Data

US 2009/0165853 A1    Jul. 2, 2009

(30) Foreign Application Priority Data

Dec. 26, 2005  (JP) ............................ 2005-371838
Apr. 5, 2006   (JP) ............................ 2006-104301

(51) Int. Cl.
*H01L 31/00*   (2006.01)
*H02N 6/00*    (2006.01)

(52) U.S. Cl. ................. 136/252; 136/258; 136/261; 257/51; 257/53; 257/64; 257/65; 257/440

(58) Field of Classification Search ............ 136/258, 136/252, 261; 257/51, 63, 64, 438, 440
See application file for complete search history.

(56) References Cited

U.S. PATENT DOCUMENTS 4,398,054 A    8/1983    Madan (Continued)

FOREIGN PATENT DOCUMENTS

JP    59-972 A    1/1984

(Continued)

OTHER PUBLICATIONS

Yang et al., Amorphous and nanocrystalline based multi junction solar cells, 2004.*

(Continued)

*Primary Examiner*—Jennifer K Michener
*Assistant Examiner*—Matthew T Martin
(74) *Attorney, Agent, or Firm*—Birch, Stewart, Kolasch & Birch, LLP

(57) ABSTRACT

The present invention makes it possible to provide a stacked-type thin-film photoelectric conversion device having high photostability, at a high yield rate and significantly reduced production costs. In a stacked-type photoelectric conversion device having an amorphous silicon-based photoelectric conversion unit and a crystalline silicon-based photoelectric conversion unit stacked thereon or vice versa, an amorphous photoelectric conversion layer included in the amorphous photoelectric conversion unit has a thickness of at least 0.03 µm and less than 0.17 µm, a crystalline photoelectric conversion layer included in the crystalline photoelectric conversion unit has a thickness of at least 0.2 µm and less than 1.0 µm, and a silicon oxide layer of a first conductivity type included in the amorphous photoelectric conversion unit and a silicon layer of a second conductivity type included in the crystalline photoelectric conversion unit make a junction.

8 Claims, 3 Drawing Sheets

U.S. PATENT DOCUMENTS

| | | | |
|---|---|---|---|
| 4,476,346 A | 10/1984 | Tawada et al. | |
| 6,384,319 B1 * | 5/2002 | Sasaki et al. | 136/258 |
| 2002/0014263 A1 | 2/2002 | Sasaki | |

FOREIGN PATENT DOCUMENTS

| | | | |
|---|---|---|---|
| JP | 59-108370 A | | 6/1984 |
| JP | 64-84672 A | | 3/1989 |
| JP | 2-82582 A | | 3/1990 |
| JP | 03227072 | * | 10/1991 |
| JP | 5-95126 A | | 4/1993 |
| JP | 9-162431 A | | 6/1997 |
| JP | 11-186574 A | | 7/1999 |
| JP | 2000-138384 A | | 5/2000 |
| JP | 2001-177134 A | | 6/2001 |
| JP | 2001-274430 A | | 10/2001 |
| JP | 2001-308362 A | | 11/2001 |
| JP | 2002-9312 A | | 1/2002 |
| JP | 2002-9313 A | | 1/2002 |
| JP | 2003-258279 A | | 9/2003 |
| JP | 2003-298088 A | | 10/2003 |
| JP | 2004-179371 A | | 6/2004 |

OTHER PUBLICATIONS

K. J. Stout et al., "The development of methods for characterization of roughness on three dimensions", Publication No. EUR 15178 EN of the Commission of the European Communities, Luxembourg, pp. 230-231, 1994.

* cited by examiner 2a 4a 5a  7a              6a     8a   7b

STACKED-TYPE PHOTOELECTRIC CONVERSION DEVICE

TECHNICAL FIELD

The present invention relates to a stacked-type photoelectric conversion device that includes an amorphous silicon-based photoelectric conversion unit and a crystalline silicon-based photoelectric conversion unit stacked thereon or vice versa.

BACKGROUND ART

In recent years, to achieve low cost as well as high efficiency of photoelectric conversion devices, thin-film solar batteries that need only a small amount of raw material have attracted attention and have been developed intensively. At present, crystalline thin-film solar batteries have also been developed in addition to the conventional amorphous thin-film solar batteries, and a stacked-type thin-film solar battery referred to as a hybrid solar battery, in which the crystalline and amorphous thin-film solar units are stacked, has also been put into practical use.

The thin-film solar battery generally includes a transparent conductive film, at least one semiconductor thin-film photoelectric conversion unit, and a back electrode stacked in this order on a light-transmissive substrate (also referred to as a transparent substrate). A single photoelectric conversion unit includes an i-type layer sandwiched between a p-type layer and an n-type layer.

To effectively confine light incident on the transparent substrate side into the photoelectric conversion unit, numerous fine surface concavities and convexities are usually formed on the transparent conductive film. The level difference in the surface unevenness generally falls in a range of approximately 0.05 μm-0.3 μm. To determine the uneven surface shape of the transparent electrode layer, optimal for the thin-film solar battery, there is needed an index that can quantitatively represent the uneven shape. For example, a haze ratio has conventionally been used as the index that can represent the uneven surface shape.

The haze ratio is an index for optically evaluating the surface unevenness of a transparent substrate and is expressed as (diffuse transmittance/total transmittance)×100 [%] (JIS K7136). For measurement of the haze ratio, a haze meter that can automatically measure the haze ratio is commercially available and enables easy measurement. As a light source for the measurement, there is generally used a C light source.

In general, the larger the level difference of the surface unevenness is made, the higher the haze ratio becomes, and thus light having entered the photoelectric conversion unit can more effectively be confined. However, when the surface unevenness has an excessively large level difference, a photoelectric conversion unit cannot be uniformly formed on the uneven surface and then partial deficiencies may be caused in a p-type layer, an i-type layer, or an n-type layer. In such a case, minute current leakage occurs via the deficient parts, causing deterioration in photoelectric conversion properties. Therefore, it is also desired that the surface unevenness of the transparent conductive film is gentle to a certain extent.

As an index that can represent such a surface shape, a surface area ratio (Sdr) is effective. The surface area ratio is also referred to as a Developed Surface Area Ratio, and abbreviated as Sdr. Sdr is defined by Expressions 1 and 2 as follows (K. J. Stout, P. J. Sullivan, W. P. Dong, E. Manisah, N. Luo, T. Mathia: "The development of methods for characterization of roughness on three dimensions", Publication no. EUR 15178 EN of the Commission of the European Communities, Luxembourg, pp. 230-231, 1994).

[Mathematical Expression 1]

$$S_{dr} = \frac{\left(\sum_{j}^{M-1}\sum_{k}^{N-1} A_{jk}\right) - (M-1)(N-1)\Delta X \Delta Y}{(M-1)(N-1)\Delta X \Delta Y} \times 100\%$$ (Expression 1)

$$A_{jk} = \frac{1}{2}\left[\sqrt{\Delta Y^2 + \{Z(x_j, y_k) - Z(x_j, y_{k+1})\}^2} + \sqrt{\Delta Y^2 + \{Z(x_{j+1}, y_k) - Z(x_{j+1}, y_{k+1})\}^2}\right] \times \frac{1}{2}\left[\sqrt{\Delta X^2 + \{Z(x_j, y_k) - Z(x_{j+1}, y_k)\}^2} + \sqrt{\Delta X^2 + \{Z(x_j, y_{k+1}) - Z(x_{j+1}, y_{k+1})\}^2}\right]$$ (Expression 2)

Here, M and N represent the numbers obtained by dividing an entire measurement region by a minute length ΔX in the x direction and a minute length ΔY in the y direction, respectively. Z(x, y) represents a height at a prescribed position (x, y) in a minute measurement region ΔXΔY. Sdr represents an increase ratio of an actual surface area to a flat area in the entire measurement region. In other words, the larger and sharper the unevenness is, the larger the value of Sdr becomes. Sdr can be measured with a scanning microscope such as an AFM (atomic force microscope) or an STM (scanning transmission microscope).

The i-type layer, which is substantially an intrinsic semiconductor layer, occupies a large part of thickness of the photoelectric conversion unit, and photoelectric conversion mainly occurs in the i-type layer. Therefore, the i-type layer is usually referred to as an i-type photoelectric conversion layer or simply referred to as a photoelectric conversion layer. The photoelectric conversion layer is not limited to the intrinsic semiconductor layer, and it may be a slightly doped p-type or n-type layer as long as loss of light absorbed by impurities (dopant) is not problematic. While the photoelectric conversion layer preferably has a larger thickness for its better light absorption, an excessive increase of the thickness inevitably increases cost and time for depositing the layer.

On the other hand, the conductivity-type semiconductor layers of a p-type and an n-type play a role of generating an internal electric field in the photoelectric conversion unit, and the intensity of the internal electric field influences the value of open-circuit voltage (Voc) that is one of the important properties of the thin-film solar battery. However, these conductivity-type semiconductor layers are inactive layers that do not directly contribute to photoelectric conversion, and light absorbed by impurities with which the conductivity-type semiconductor layers are doped becomes loss that cannot contribute to power generation. Accordingly, the conductivity-type semiconductor layers of the p- and n-types preferably have their thicknesses as small as possible on condition that they can generate a sufficient internal electric field. Generally, each of the conductivity-type semiconductor layers is approximately at most 20 nm in thickness.

Here, when a photoelectric conversion unit or a thin-film solar battery includes an amorphous photoelectric conversion layer occupying the substantial part thereof, it is referred to as an amorphous photoelectric conversion unit or an amorphous thin-film solar battery, and when it includes a crystalline photoelectric conversion layer, it is referred to as a crystalline photoelectric conversion unit or a crystalline thin-film solar battery, regardless of whether the conductivity-type semiconductor layers of the p- and n-types included therein are amorphous or crystalline.

As a method of improving conversion efficiency of the thin-film solar battery, there is a method of stacking at least two photoelectric conversion units. In this case, a front unit including a photoelectric conversion layer of a large band gap is disposed on the light incident side of the thin-film solar battery, and rear units each including a photoelectric conversion layer of a smaller band gap are disposed in descending order of the band gap on the rear side of the front unit, so that photoelectric conversion becomes possible in a wide wavelength range of incident light and thus conversion efficiency of the entire solar battery can be improved. Among such stacked-type solar batteries, particular one referred to as a silicon hybrid solar battery includes an amorphous silicon-based photoelectric conversion unit and a crystalline silicon-based photoelectric conversion unit stacked and electrically connected in series.

For example, the wavelength of light that can be photoelectrically converted by amorphous i-type silicon is up to approximately 800 nm on the longer-wavelength side, while the wavelength of light that can be photoelectrically converted by crystalline i-type silicon is longer and up to approximately 1150 nm.

Among output properties of the silicon hybrid solar battery, short-circuit current density (Jsc) is influenced by the relation between a spectral sensitivity integral current of the amorphous silicon-based photoelectric conversion unit disposed on the front side (hereinafter referred to as a "top cell") and a spectral sensitivity integral current of the crystalline silicon-based photoelectric conversion unit disposed on the rear side (hereinafter referred to as a "bottom cell"). Here, the spectral sensitivity integral current means output current density calculated by integrating the product of measured spectral sensitivity of the photoelectric conversion unit and spectral intensity of sunlight typically represented as air mass 1.5, with respect to each wavelength. More specifically, if the spectral sensitivity integral current of the bottom cell is larger than that of the top cell, Jsc of the entire solar battery is limited to the spectral sensitivity integral current of the top cell. In contrast, if the spectral sensitivity integral current of the bottom cell is smaller, Jsc of the entire solar battery is limited to the spectral sensitivity integral current of the bottom cell.

An amorphous silicon-based photoelectric conversion layer generally having a large light absorption coefficient can obtain sufficient Jsc even if it has a thickness of approximately at most 0.3 µm for light absorption. However, in order that a crystalline silicon-based photoelectric conversion layer generally having a small light absorption coefficient can sufficiently absorb light of a longer wavelength as well, it desirably has a thickness of approximately 1.5-3 µm. In other words, it is usually desired that the crystalline silicon-based photoelectric conversion layer should have a thickness approximately 5-10 times as large as a thickness of the amorphous silicon-based photoelectric conversion layer. Similarly, in the silicon hybrid solar battery as well, it is also desired to maintain the thickness ratio of the crystalline photoelectric conversion layer to the amorphous photoelectric conversion layer to be approximately 5-10 (see Patent Document 1, i.e. Japanese Patent Laying-Open No. 2001-177134 and Patent Document 2, i.e. Japanese Patent Laying-Open No. 2001-308362). If the thickness of the crystalline photoelectric conversion layer is made smaller with respect to this relation, Jsc of the entire solar battery will be a value limited to the spectral sensitivity integral current of the bottom cell.

Patent Document 1: Japanese Patent Laying-Open No. 2001-177134

Patent Document 2: Japanese Patent Laying-Open No. 2001-308362

DISCLOSURE OF THE INVENTION

Problems to be Solved by the Invention

In general, it is effective in improving conversion efficiency of the stacked-type solar battery to set the thickness ratio between the amorphous silicon-based photoelectric conversion layer and the crystalline silicon-based photoelectric conversion layer such that the spectral sensitivity integral current value of the top cell coincides with that of the bottom cell. However, the film-deposition rate of the crystalline silicon-based photoelectric conversion layer is not so high as that of the amorphous silicon-based photoelectric conversion layer, and hence as to the silicon hybrid solar battery, the thickness of the crystalline silicon-based photoelectric conversion layer influences production costs of the entire solar battery. Furthermore, it is widely known that the spectral sensitivity integral current of the amorphous silicon photoelectric conversion layer included in the top cell of the silicon hybrid solar battery is lowered owing to light-induced degradation (Staebler-Wronsky effect) caused by long-term light irradiation. It is also known that the light-induced degradation can be less when the amorphous layer has a smaller thickness.

Accordingly, it is desired (1) that the thickness of the crystalline silicon-based photoelectric conversion layer should be made as small as possible on condition that performance of the entire hybrid solar battery is not deteriorated, and (2) that the thickness of the amorphous silicon-based photoelectric conversion layer should preliminarily be designed to be small in view of decrease in spectral sensitivity integral current due to the light-induced degradation. However, even if such design is prepared, the silicon hybrid solar battery is still under the circumstances where the thickness of the crystalline silicon-based photoelectric conversion layer influences production costs of the entire solar battery.

From another viewpoint, in the case of making a large-area silicon hybrid solar battery capable of generating high power at high voltage, such as a solar battery for power supply, it is a common practice to divide a silicon hybrid solar battery formed on a large substrate into a plurality of cells, and also connect and integrate these cells in series. In that case, Patent Document 1 describes that it is preferable to set the amorphous silicon-based photoelectric conversion layer to a thickness of at least 0.25 µm, and set the crystalline silicon-based photoelectric conversion layer to a thickness of less than 3 µm and four to eight times as large as the thickness of the amorphous silicon-based photoelectric conversion layer, from a viewpoint of facilitating the integration with a method of laser scribing.

Furthermore, Patent Document 2 describes that it is possible to suppress peeling of the integrated crystalline silicon-based photoelectric conversion layer by setting the crystalline silicon-based photoelectric conversion layer to a thickness of 1-1.5 µm. Accordingly, when the above-described teachings of Patent Documents 1 and 2 are comprehensively considered, the best way is to set the thickness of the amorphous silicon-based photoelectric conversion layer to at least 0.25 µm and make the thickness of the crystalline silicon-based photoelectric conversion layer as small as possible within a range of approximately 1-2 µm to maximize Jsc, in consideration of productivity of the silicon hybrid solar battery. However, when the light-induced degradation of amorphous silicon is considered, it is not always the best way to set the thickness of the amorphous silicon-based photoelectric conversion layer to at least 0.25 μm, and furthermore, there still remains the circumstances where the thickness of the crystalline silicon-based photoelectric conversion layer influences production costs of the entire hybrid solar battery.

In view of such circumstances, in connection with the stacked-type photoelectric conversion device in which the amorphous silicon-based photoelectric conversion unit and the crystalline silicon-based photoelectric conversion unit are stacked, an object of the present invention is to (1) reduce production costs of the entire device, (2) suppress the light-induced degradation of the amorphous silicon-based photoelectric conversion layer, and furthermore, (3) overcome the difficulty in integrating the photoelectric conversion units.

Means for Solving the Problems

According to the present invention, a stacked-type photoelectric conversion device including an amorphous silicon-based photoelectric conversion unit and a crystalline silicon-based photoelectric conversion unit stacked therein, wherein an amorphous photoelectric conversion layer included in the amorphous photoelectric conversion unit has a thickness of at least 0.03 μm and less than 0.17 μm; a crystalline photoelectric conversion layer included in the crystalline photoelectric conversion unit has a thickness of at least 0.2 μm and less than 1.0 μm; and a silicon oxide layer of a first conductivity type included in the amorphous photoelectric conversion unit and a silicon layer of a second conductivity type included in the crystalline photoelectric conversion unit make a junction.

The silicon oxide layer of the first conductivity type can carry out a function of generating an internal electric field in the amorphous photoelectric conversion layer that is in contact therewith, and because of its relatively high electric resistivity, can also carry out a function of suppressing current leakage even under the circumstances where the amorphous photoelectric conversion layer is thin and liable to includes deficient parts.

For a material of the amorphous photoelectric conversion layer, silicon-germanium is more preferable besides silicon, from a viewpoint of easy adjustability of its band gap and also a viewpoint of its light-induced degradation property.

On the other hand, the silicon oxide layer of the first conductivity type preferably has a thickness of at least 5 nm and less than 20 nm, so as to make light absorption loss caused thereby as small as possible.

Furthermore, it is preferable that the crystalline photoelectric conversion unit includes a silicon oxide layer of the first conductivity type on a side of the crystalline photoelectric conversion layer farther from the amorphous photoelectric conversion unit, because light confinement inside the crystalline photoelectric conversion layer is further promoted.

In the present invention, the silicon oxide layer of the first conductivity type included in the amorphous photoelectric conversion unit and the silicon layer of the second conductivity type included in the crystalline photoelectric conversion unit make a junction as described above, so that even if the thickness of each of the photoelectric conversion layers is significantly reduced than conventional, current leakage is less likely to occur, and there is exhibited a remarkable effect of maintaining performance particularly when the photoelectric conversion units are integrated.

Stated differently, in the present invention, it is possible to obtain more remarkable effects in the stacked-type photoelectric conversion device in which a transparent electrode layer, the amorphous photoelectric conversion unit, and the crystalline photoelectric conversion unit stacked in this order on a transparent insulating substrate are separated by a plurality of parallel linear isolation grooves so as to form a plurality of strip-like stacked-type photoelectric conversion cells, and in which the plurality of cells are electrically connected and integrated in series via a plurality of connection grooves extending in parallel with the isolation grooves.

Furthermore, in the present invention, it is possible to obtain more remarkable effects in the stacked-type photoelectric conversion device in which the crystalline photoelectric conversion unit, the amorphous photoelectric conversion unit, and a transparent electrode layer stacked in this order on an insulating substrate are separated by a plurality of parallel linear isolation grooves so as to form a plurality of strip-like stacked-type photoelectric conversion cells, and in which the plurality of cells are electrically connected and integrated in series via a plurality of connection grooves extending in parallel with the isolation grooves.

Effects of the Invention

As described above, according to the present invention, in connection with the stacked-type photoelectric conversion device in which the amorphous silicon-based photoelectric conversion unit and the crystalline silicon-based photoelectric conversion unit are stacked, it is possible to obtain a photoelectric conversion device having high photostability at low production costs and a high yield rate by (1) significantly decreasing the thickness of the crystalline silicon-based photoelectric conversion layer with respect to the conventional one to thereby reduce production costs of the entire device, (2) significantly decreasing the thickness of the amorphous silicon-based photoelectric conversion layer that generally involves the light-induced degradation to thereby suppress the light-induced degradation, and (3) overcoming the difficulty in integration caused in the case of decreasing the thickness of each of the photoelectric conversion layers.

DESCRIPTION OF THE REFERENCE SIGNS

1: transparent substrate, 1$i$: transparent insulating substrate, 2: transparent conductive film, 3: amorphous silicon-based photoelectric conversion unit, 3$p$: amorphous p-type silicon carbide layer, 3$i$: amorphous i-type silicon-based photoelectric conversion layer, 3$bi$: i-type silicon layer just before crystallization, 3$n$: n-type silicon oxide layer, 4: crystalline silicon-based photoelectric conversion unit, 4$p$: crystalline p-type silicon layer, 4$i$: crystalline i-type silicon-based photoelectric conversion layer, 4$n$: crystalline n-type silicon layer, 5: back electrode layer, 5$t$: transmissive-reflective layer, 5$u$: back underlayer, 5$v$: light-absorptive back layer, 5$m$: metallic back layer, 2$a$: isolation groove between transparent electrodes (isolation groove in transparent conductive film), 4a: connection groove, 5a: isolation groove between back electrodes (isolation groove in back electrode layer), 6a: isolation groove for mini-module (isolation groove in solar battery), 7a, 7b: connection groove for electrode extraction, 8a: split line.

BEST MODES FOR CARRYING OUT THE INVENTION

Figure 1:
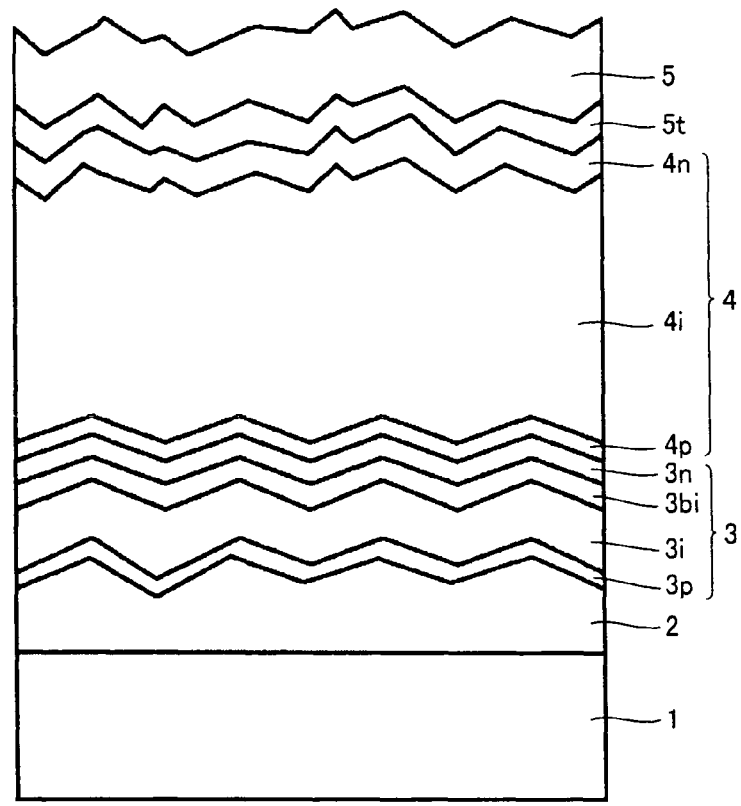
FIG. 1 is a schematic cross-sectional view of a silicon hybrid solar battery according to the present invention.

The schematic cross-sectional view of FIG. 1 illustrates a silicon hybrid solar battery (stacked-type photoelectric conversion device) according to an embodiment of the present invention. In the solar battery, a transparent conductive film 2 is formed on a transparent substrate 1. For transparent substrate 1, it is possible to use a plate-like member or a sheet-like member made of glass, transparent resin, or the like.

For transparent conductive film 2, it is possible to use metal oxide such as tin oxide or zinc oxide. Transparent conductive film 2 can be formed by a method such as CVD (chemical vapor deposition), sputtering, or evaporation. Transparent conductive film 2 has fine surface unevenness formed under elaborated conditions for its deposition and thereby has an effect of enhancing scattering of incident light. More specifically, in transparent conductive film 2, the level difference of the surface unevenness is set to approximately 0.05-0.3 µm, the sheet resistivity is set to approximately 5-20Ω/□, and the surface area ratio Sdr is set to approximately 20-60%. The larger Sdr value is preferable in order to more effectively increase scattering of incident light. However, an excessively large Sdr value means that the surface unevenness of transparent conductive film 2 is steep and sharp, and hence in such a case if a photoelectric conversion unit formed on the film has a small thickness, current leakage or the like is liable to occur. Accordingly, it is more preferable that Sdr is approximately 25-45%.

Formed on transparent conductive film 2 is an amorphous silicon-based photoelectric conversion unit 3, which is a top cell. Amorphous photoelectric conversion unit 3 includes an amorphous p-type silicon carbide layer 3p, an amorphous i-type silicon-based photoelectric conversion layer 3i, an i-type silicon layer 3bi just before crystallization, and an n-type silicon oxide layer 3n. Here, the layer just before crystallization means a layer which should start crystallization if it were deposited to a thickness of, e.g., at least 50 nm under prescribed deposition conditions, and has not yet crystallized when it is deposited to a thickness of, e.g., approximately 15 nm under the same conditions. The thickness of amorphous i-type silicon-based photoelectric conversion layer 3i is set to at least 0.02 µm and less than 0.17 µm. The material of amorphous i-type silicon-based photoelectric conversion layer 3i may contain band-gap-adjusting elements such as carbon, germanium, or the like, in addition to silicon.

For example, for the material of amorphous i-type silicon-based photoelectric conversion layer 3i, amorphous silicon-germanium is preferable besides silicon, from a viewpoint of easy adjustability of its band gap and also a viewpoint of its light-induced degradation property. The germanium content in the amorphous silicon-germanium layer preferably falls in a range of 1-45 atomic %, and more preferably in a range of 1-30 atomic %. If the amorphous i-type silicon-germanium photoelectric conversion layer has a higher germanium content, the band gap becomes narrower, so that it becomes possible to reduce the film thickness for obtaining photosensitivity sufficient for serving as a photoelectric conversion layer in the top cell. However, the higher content of germanium generally tends to increase the light-induced degradation rate of the amorphous silicon-based photoelectric conversion unit in the top cell, even though the degradation rate also depends on the film-deposition conditions. Therefore, the preferable germanium content is set to fall within the above-described ranges.

As to n-type silicon oxide layer 3n, its thickness is preferably at least 5 nm and less than 20 nm, in order to make light absorption loss therein as small as possible and generate a sufficient internal electric field in amorphous i-type silicon-based photoelectric conversion layer 3i, and in order not to increase the series resistivity component of the solar battery, because n-type silicon oxide layer 3n itself has relatively higher resistivity. Furthermore, as to n-type silicon oxide layer 3n, it is desirable that its electrical conductivity is approximately $10^{-9}$-$10^{-6}$ S/cm, that its refractive index for light of 600 nm wavelength is at most 2.2, and further that its oxygen content measured by XPS (X-ray photoelectron spectroscopy) is at least 35 atomic %. The reason why electric conductivity of n-type silicon oxide layer 3n is set to fall in the above-described range is also to suppress leakage caused by direct contact of n-type silicon oxide layer 3n and transparent conductive film 2 that is disposed closer to the light incident side, wherein the direct contact is caused by particles or the like that may be generated during formation of amorphous i-type silicon-based photoelectric conversion layer 3i. Note that n-type silicon oxide layer 3n may also contain an element such as nitrogen or carbon.

Formed on amorphous silicon-based photoelectric conversion unit 3 is a crystalline silicon-based photoelectric conversion unit 4 as a bottom cell. Crystalline silicon-based photoelectric conversion unit 4 includes a crystalline p-type silicon layer 4p, a crystalline i-type silicon-based photoelectric conversion layer 4i, and a crystalline n-type silicon layer 4n. Crystalline i-type silicon-based photoelectric conversion layer 4i has a thickness of at least 0.2 µm and less than 1.0 µm, and its material may contain not only silicon but also a band-gap-adjusting element such as germanium added to silicon. Note that it is more preferable to use, instead of crystalline n-type silicon layer 4n, a composite layer in which a low-refractive index layer of a material such as n-type silicon oxide and a crystalline n-type silicon layer are stacked to thereby effectively reflect longer-wavelength light that have not completely be absorbed by the bottom cell significantly thinner than the conventional one, again to the bottom cell side.

A high-frequency plasma CVD method is suitable for forming amorphous silicon-based photoelectric conversion unit 3 and crystalline silicon-based photoelectric conversion unit 4. For conditions for depositing these silicon-based photoelectric conversion units, it is possible to preferably set a substrate temperature of 100-250° C., a pressure of 30-1500 Pa, and high-frequency power density of 0.01-0.5 W/cm². For a source gas used for depositing the silicon-based photoelectric conversion units, it is possible to use a silicon-containing gas such as $SiH_4$ or $Si_2H_6$, or a mixed gas of these silane-based gases and hydrogen. If germanium is added to the i-type photoelectric conversion layer in the silicon-based photoelectric conversion unit, $GeH_4$ can preferably be added to the above-described source gas. For a dopant gas for forming the p-type layer or the n-type layer in the silicon-based photoelectric conversion unit, it is possible to preferably use $B_2H_6$, $PH_3$, or the like. For forming the silicon oxide layer, carbon dioxide can preferably be used in addition to the above-described source gas.

Formed on n-type silicon layer 4n is a back electrode layer 5. For back electrode layer 5, it is possible to preferably use Ag, Al, or an alloy thereof. Between back electrode layer 5 and n-type silicon layer 4n, a transmissive-reflective layer 5t may be inserted also for a purpose of preventing diffusion of metal from back electrode layer 5 to n-type silicon layer 4n. For transmissive-reflective layer 5t, it is possible to use metal oxide such as ZnO or ITO (indium tin oxide), which has relatively higher resistivity and excellent transparency. For forming transmissive-reflective layer 5t and back electrode layer 5, it is possible to preferably use a method such as sputtering or evaporation.

In the above-described embodiment, there has been described a double-decker stacked-type solar battery in which amorphous silicon-based photoelectric conversion unit 3 and crystalline silicon-based photoelectric conversion unit 4 are stacked. However, it is also possible to add a band-gap-adjusting element such as carbon or germanium to silicon, or adopt a triple-decker tandem structure in which a crystalline silicon-based photoelectric conversion unit is further stacked on crystalline silicon-based photoelectric conversion unit 4 stacked on amorphous silicon-based photoelectric conversion unit 3, or increase the number of amorphous silicon-based photoelectric conversion units stacked.

Furthermore, it is also possible to adopt the so-called reverse type in which the layers are formed in totally reverse order with respect to that in the above-described steps, such as in order of crystalline silicon-based photoelectric conversion unit 4, amorphous silicon-based photoelectric conversion unit 3, and transparent conductive film 2, on the insulating substrate. In this case, as the insulating substrate, it is also possible to use an insulating substrate in which an insulating layer of resin or the like is formed on a metal substrate, besides a transparent insulating substrate formed as a plate-like member or a sheet-like member of glass, transparent resin, or the like.

EXAMPLES

Stacked-type silicon-based thin-film solar batteries according to examples 1-6 of the present invention will hereinafter be described with reference to FIG. 2, in comparison with comparative examples 1-4.

Example 1

Figure 2:
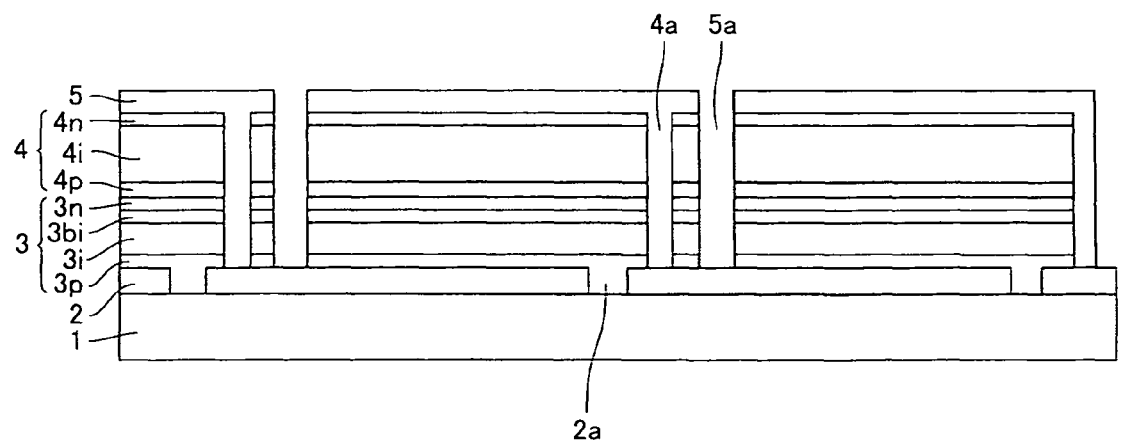
FIG. 2 is a schematic cross-sectional view of an integrated-type silicon hybrid solar battery according to the present invention.

FIG. 2 is a cross-sectional view that schematically shows an integrated-type silicon hybrid solar battery produced in example 1 of the present invention. For producing the solar battery, a white glass plate of 910 mm×455 mm×4 mm was initially used as transparent substrate 1. On an upper surface of transparent substrate 1, transparent conductive film 2 of tin oxide having a fine surface unevenness structure was formed by a thermal CVD method. The obtained transparent conductive film 2 had a thickness of 0.8 μm, a haze ratio of 15% and a sheet resistivity of 12Ω/□. The haze ratio was measured from the side of transparent conductive film 2 under a C light source with a haze meter of an NDH5000W type available from NIPPON DENSHOKU INDUSTRIES CO., LTD. Furthermore, measurement with an atomic force microscope (AFM) was carried out using a noncontact mode of a Nano-R system (available from Pacific Nanotechnology, Inc.), and Sdr of 47% was obtained from an AFM image wherein a square area with each side of 5 μm was divided along each side into 256×256 pieces and observed.

Although not shown in FIG. 2, an antireflective film including silica fine particles was formed on a bottom surface of transparent substrate 1 in example 1. To divide transparent conductive film 2 into a plurality of band-like patterns, irradiation with YAG (yttrium-aluminum-garnet) fundamental wave pulse laser was applied thereto through transparent substrate 1 thereby forming isolation grooves 2a of 50 μm width in transparent electrode layer 2, and then ultrasonic cleaning and drying were conducted.

Furthermore, to form amorphous silicon-based photoelectric conversion unit 3, transparent substrate 1 having transparent conductive film 2 formed thereon was introduced into a high-frequency plasma CVD apparatus, and amorphous p-type silicon carbide (p-type a-SiC) layer 3p of 15 nm thickness was deposited. Successively, amorphous i-type silicon-based photoelectric conversion layer 3i of 0.11 μm thickness, i-type silicon layer 3bi of 15 nm thickness just before crystallization, and further n-type silicon oxide layer 3n of 10 nm thickness were stacked in this order. $SiH_4$, hydrogen, $B_2H_6$ diluted with hydrogen, and $CH_4$ were used as a reactant gas for forming p-type a-SiC layer 3p. When p-type a-SiC layer 3p was deposited to achieve a thickness of approximately 8 nm, the supply of $B_2H_6$ diluted with hydrogen, and $CH_4$ was stopped with discharging maintained, and then film-deposition was conducted to achieve an additional thickness of 7 nm.

$SiH_4$, hydrogen, $PH_3$ diluted with hydrogen, and $CO_2$ were used as a reactant gas for forming n-type silicon oxide layer 3n. In the plasma CVD conditions, a substrate temperature was 180° C., a spacing between a film-deposition surface of the substrate and a discharge electrode was 10-15 mm, a pressure was 350-1300 Pa, a high-frequency power density was 0.11-0.25 W/cm$^2$, and a flow rate ratio of $SiH_4/CO_2/PH_3$ diluted with hydrogen to 0.5%/hydrogen was 1/3.1-3.6/11/225. As to a single n-type silicon oxide layer deposited to a thickness of 300 nm on a glass plate under the same plasma CVD conditions, a refractive index for light of 600 nm wavelength was 2.0-1.9, an electrical conductivity was $2\times10^{-8}$-$5\times10^{-7}$ S/cm, and an oxygen content in the film was 48-52 atomic % that was measured by XPS. Incidentally, an amount of silicon in the n-type silicon oxide layer was 51-47 atomic %. Furthermore, when a Raman scattering spectrum of the n-type silicon oxide layer was measured, there was observed no peak attributable to crystalline silicon.

In order to further form crystalline silicon-based photoelectric conversion unit 4 on n-type silicon oxide layer 3n, the plasma CVD apparatus was successively used so as to stack crystalline p-type silicon layer 4p of 15 nm thickness, crystalline i-type silicon-based photoelectric conversion layer 4i of 0.4 μm thickness, n-type silicon oxide layer 4n of 60 nm thickness, and crystalline n-type silicon layer (not shown) of 7 nm thickness, in this order.

Subsequently, to divide amorphous silicon-based photoelectric conversion unit 3 and crystalline silicon-based photoelectric conversion unit 4 into a plurality of band-like patterns, the substrate was brought in the air from the plasma CVD apparatus, and connection grooves 4a of 60 μm width were formed by irradiation with YAG second harmonic pulse laser through transparent substrate 1. Next, a ZnO transmissive-reflective layer (not shown in FIG. 2) of 30 nm thickness and an Ag back electrode layer 5 of 200 nm thickness were formed by a DC (direct current) sputtering method. Lastly, to divide amorphous silicon-based photoelectric conversion unit 3, crystalline silicon-based photoelectric conversion unit 4, and back electrode layer 5 into a plurality of band-like patterns, isolation grooves 5a of 60 μm between back electrodes were formed by irradiation with YAG second harmonic pulse laser through transparent substrate 1, and as shown in FIG. 2, there was produced an integrated-type silicon hybrid solar battery in which strip-like hybrid solar cells located adjacently in a lateral direction were electrically connected in series. The integrated-type silicon hybrid solar battery was formed with a series of 100 hybrid solar cells, each of which had a width of 8.9 mm×a length of 430 mm, connected electrically in series.

Figure 3:
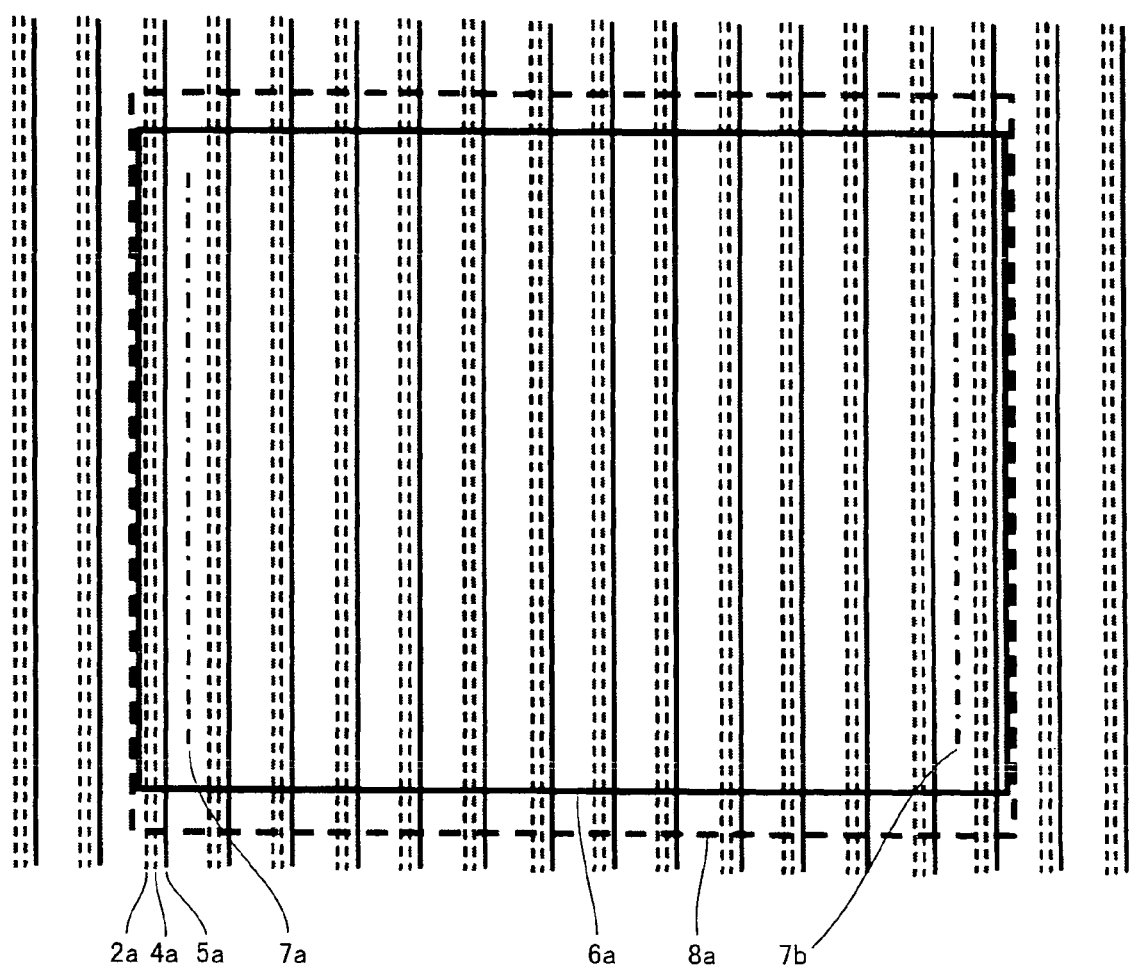
FIG. 3 is a schematic plan view for explaining a method of forming mini-modules by dividing the integrated-type silicon hybrid solar battery.

FIG. 3 is a schematic plan view of the integrated-type silicon hybrid solar battery formed as described above. To divide the integrated-type silicon hybrid solar battery into a plurality of small rectangular integrated-type solar battery regions, irradiation with YAG fundamental wave pulse laser and irradiation with YAG second harmonic pulse laser were successively applied through transparent substrate 1, thereby forming a solar battery isolation groove 6a that penetrates all transparent conductive film 2, amorphous silicon-based photoelectric conversion unit 3, crystalline silicon-based photoelectric conversion unit 4, and back electrode layer 5. Furthermore, connection grooves 7a, 7b for electrode extraction for making contacts with transparent conductive film 2 were formed in the solar cells located at opposite sides in the small solar battery region. On each of connection grooves 7a, 7b for electrode extraction, a lead (not shown) was soldered. By doing so, on transparent substrate 1 of 910 mm×455 mm, there were formed a plurality of integrated-type silicon hybrid solar battery mini-modules (hereinafter simply referred to as "mini-modules"), in each of which 11-segmented hybrid solar cells each having a width of 8.9 mm×a length of 100 mm were connected in series.

By bending and dividing transparent substrate 1 along split line 8a in FIG. 3, there were obtained mini-modules each having a size of 125 mm×125 mm. Subsequently, the top surface of back electrode layer 5 was sealed by an organic protective layer with a sealing resin layer of EVA (ethylene-vinyl acetate copolymer) interposed therebetween (both layers are not shown). Three sealed mini-modules obtained as such were irradiated with artificial sunlight having a spectrum approximated to air mass 1.5 and a energy density of 100 mW/cm$^2$, under the condition that the temperature of the atmosphere and the mini-modules was 25±1° C., to measure the initial current-voltage property of these mini-modules. Table 1 includes the measurement results (mean values of the three mini-modules) of open-circuit voltage Voc per cell (i.e., obtained by dividing the measured open-circuit voltage by the number 11 of segmented cells), short-circuit current density Jsc, fill factor FF, and conversion efficiency Eff.

Next, to measure properties of the three mini-modules after the light-induced degradation (i.e., after stabilization), the mini-modules were irradiated with artificial sunlight of energy density of 500 mW/cm$^2$ for 20 hours under the condition that a surface temperature of the back electrode was 50±5° C., and then further irradiated with artificial sunlight of energy density of 100 mW/cm$^2$ for 550 hours under the condition that a surface temperature of the back electrode was 50±5° C. Table 1 also includes mean values of Voc, Jsc, FF, and Eff of the three mini-modules after stabilized as such.

TABLE 1

|  | thickness of amorphous i-type silicon photoelectric conversion layer (μm) | thickness of crystalline i-type silicon photoelectric conversion layer (μm) | condition for output measurement | Voc (V) | Jsc (mA/cm$^2$) | FF | Eff (%) |
|---|---|---|---|---|---|---|---|
| Example 1 | 0.11 | 0.4 | initial state | 1.33 | 9.97 | 0.74 | 9.81 |
|  |  |  | after stabilization | 1.36 | 9.88 | 0.69 | 9.31 |
| Example 2 | 0.11 | 0.4 | initial state | 1.40 | 10.04 | 0.74 | 10.47 |
|  |  |  | after stabilization | 1.39 | 9.85 | 0.71 | 9.73 |
| Example 3 | 0.09 | 0.3 | initial state | 1.32 | 9.21 | 0.72 | 8.78 |
|  |  |  | after stabilization | 1.35 | 9.18 | 0.69 | 8.53 |
| Example 4 | 0.07 | 0.3 | initial state | 1.34 | 8.80 | 0.72 | 8.47 |
| Example 5 | 0.11 | 0.6 | initial state | 1.33 | 9.47 | 0.73 | 9.18 |
| Example 6 | 0.15 | 0.7 | initial state | 1.34 | 10.56 | 0.74 | 10.38 |
| Comparative Example 1 | 0.11 | 0.4 | initial state | 1.30 | 9.67 | 0.60 | 7.60 |
| Comparative Example 2 | 0.15 | 0.7 | initial state | 1.33 | 10.63 | 0.68 | 9.62 |
| Comparative Example 3 | 0.3 | 1.3 | initial state | 1.35 | 11.86 | 0.74 | 11.85 |
|  |  |  | after stabilization | 1.34 | 11.36 | 0.65 | 9.91 |
| Comparative Example 4 | 0.2 | 1 | initial state | 1.36 | 11.40 | 0.71 | 10.97 |
|  |  |  | after stabilization | 1.35 | 11.05 | 0.64 | 9.59 |

Example 2

An integrated-type silicon hybrid solar battery according to example 2 of the present invention was similar to that of example 1, except that transparent conductive film 2 was modified to have a haze ratio of 27%, a sheet resistivity of 9Ω/□, and Sdr of 32%. Table 1 also includes the results of measured output properties in the initial state and after the stabilization of the mini-module formed in example 2.

Example 3

An integrated-type silicon hybrid solar battery according to example 3 of the present invention was similar to that of example 1, except that the thickness of amorphous i-type silicon-based photoelectric conversion layer 3i was changed to 0.09 μm, and the thickness of crystalline i-type silicon-based photoelectric conversion layer 4i was changed to 0.3 μm. Table 1 also includes the results of measured output properties in the initial state and after the stabilization of the mini-module formed in example 3.

Examples 4-6

Integrated-type silicon hybrid solar batteries according to examples 4-6 of the present invention were similar to that of example 1, except that the thicknesses of amorphous i-type silicon-based photoelectric conversion layer 3i and crystalline i-type silicon-based photoelectric conversion layer 4i were variously changed. Table 1 also includes the results of measured output properties in the initial state of the mini-modules formed in examples 4-6.

Comparative Example 1

An integrated-type silicon hybrid solar battery according to comparative example 1 was similar to that of example 1, except that a crystalline n-type silicon layer of 30 nm thickness was formed instead of uncrystallized i-type silicon layer 3bi and n-type silicon oxide layer 3n. Table 1 also includes the results of measured output properties in the initial state of the mini-module formed in comparative example 1.

Comparative Example 2

An integrated-type silicon hybrid solar battery according to comparative example 2 was similar to that of example 6, except that a crystalline n-type silicon layer of 30 nm thickness was formed instead of uncrystallized i-type silicon layer 3bi and n-type silicon oxide layer 3n. Table 1 also includes the results of measured output properties in the initial state of the mini-module formed in comparative example 2.

Comparative Examples 3 and 4

Integrated-type silicon hybrid solar batteries according to comparative examples 3 and 4 were similar to that of comparative example 1, except that the thicknesses of amorphous i-type silicon-based photoelectric conversion layer 3i and crystalline i-type silicon-based photoelectric conversion layer 4i were changed. Table 1 also includes the results of measured output properties in the initial state and after the stabilization of the mini-modules formed in comparative examples 3 and 4.

From comparison between example 1 and comparative example 1 described above, it is found that even if photoelectric conversion layers 3i, 4i are made significantly thinner than conventional, the integration can easily be achieved with significantly small current leakage, by using a structure in which n-type silicon oxide layer 3n included in amorphous silicon-based photoelectric conversion unit 3 and the p-type silicon layer included in crystalline silicon-based photoelectric conversion unit 4 make a junction. Incidentally, the module of 100 cells before being cut into the mini-modules of example 1 each having 11 cells also achieved performance approximately equivalent to the properties of example 1 shown in Table 1.

It has conventionally been considered as common knowledge that the integration would be difficult in the case of using such thin photoelectric conversion layers as in the present invention, and that sensitivity of the bottom cell would be completely insufficient in the case of setting a thickness as small as 0.4 µm for the crystalline silicon-based photoelectric conversion layer. Therefore, even consideration has not been given to production of an integrated-type silicon hybrid solar battery including such thin photoelectric conversion layers as in the present invention. Stated differently, it has been considered that in the case of setting a thickness as small as 0.4 µm for the crystalline silicon-based photoelectric conversion layer, the current value of the bottom cell would remain approximately 9 mA/cm$^2$ in view of the absorption coefficient of crystalline silicon, and there would be no merit in using the hybrid type. Accordingly, as long as the present inventors know, such results as in example 1 are findings obtained for the first time. Note that, in the present invention, even if polarities of the n-type layer and the p-type layer are reversed, approximately the similar effects can be obtained. Furthermore, even if a crystalline n-type silicon layer and a p-type silicon oxide layer are deposited in this order, instead of i-type silicon layer 3bi just before crystallization, n-type silicon oxide layer 3n, and crystalline p-type silicon layer 4p stacked in this order, the similar effects can also be obtained.

From comparison between example 1 and example 2, it is also found that better output properties can be obtained in the integrated-type silicon hybrid solar battery of example 2 having smaller Sdr of 32%, as compared with example 1 having larger Sdr of 47%, as long as Sdr of transparent conductive film 2 falls within the range of 20-60%. While the thickness of amorphous silicon-based photoelectric conversion layer 3i is shown up to 0.07 µm in the above-described examples, it has separately been affirmed that equivalent Jsc can also be achieved with a thickness as small as approximately 0.03 µm when silicon-germanium is used instead of amorphous silicon.

According to comparison between example 1 and comparative example 3, even if the thickness of the crystalline silicon-based photoelectric conversion layer, which influences the cost of the entire integrated-type silicon hybrid solar battery, is decreased to be less than ⅓ of the original one, example 1 has Eff of 9.31% and comparative example 3 has Eff of 9.91% after the stabilization, so that the ratio therebetween is (9.91/9.31)×100=106.4%, and the difference therebetween is as small as 6.4%. In other words, it is found that, by adopting the structure according to the present invention, it is possible to achieve significant cost reduction while maintaining approximately equivalent performance, as compared with the case of adopting the conventional structure. It is also found that, if a transparent conductive film having small Sdr as in example 2 is used, the difference in performance therebetween can be made further smaller.

In the following, examples 7-9 according to the present invention will be described in comparison with comparative example 5, as to a silicon-based integrated-type thin-film solar battery in which an amorphous i-type silicon-germanium photoelectric conversion layer is used as amorphous i-type silicon-based photoelectric conversion layer 3i in the top cell.

Example 7

An integrated-type silicon hybrid solar battery according to example 7 was similar to that of example 1, except that amorphous i-type silicon-based photoelectric conversion layer 3i was replaced with an amorphous i-type silicon-germanium photoelectric conversion layer of 0.04 µm thickness, and the thickness of crystalline i-type silicon-based photoelectric conversion layer 4i was changed to 0.55 µm.

Amorphous i-type silicon-germanium photoelectric conversion layer 3i was deposited under the conditions that $SiH_4$, hydrogen, and $GeH_4$ diluted with hydrogen were used as a reactant gas, the substrate temperature was 180° C., the spacing between a film-deposition surface of the substrate and a discharge electrode was 5-15 mm, the pressure was 150-1000 Pa, the high-frequency power density was 0.01-0.05 W/cm$^2$, and a flow rate ratio of $SiH_4/GeH_4$/hydrogen was 1/0.1-0.3/20-50. When a silicon-germanium film of 300 nm thickness was formed on a glass plate under the same plasma CVD conditions and measured by XPS, the film had a germanium content of 12-16 atomic %. Table 2 includes measured output properties in the initial state and after the stabilization of the mini-module formed in example 7.

TABLE 2

| | thickness of amorphous i-type silicon-germanium photoelectric conversion layer (μm) | thickness of crystalline i-type silicon photoelectric conversion layer (μm) | condition for output measurement | Voc (V) | Jsc (mA/cm$^2$) | FF | Eff (%) |
|---|---|---|---|---|---|---|---|
| Example 7 | 0.04 | 0.55 | initial state | 1.30 | 10.14 | 0.75 | 9.89 |
| | | | after stabilization | 1.30 | 9.99 | 0.71 | 9.22 |
| Example 8 | 0.03 | 0.4 | initial state | 1.29 | 8.91 | 0.73 | 8.39 |
| Example 9 | 0.05 | 0.7 | initial state | 1.31 | 10.72 | 0.74 | 10.39 |
| Comparative Example 5 | 0.04 | 0.55 | initial state | 1.25 | 9.89 | 0.59 | 7.30 |

Examples 8 and 9

Integrated-type silicon hybrid solar batteries according to examples 8 and 9 were similar to that of example 7, except that the thickness of amorphous i-type silicon-germanium photoelectric conversion layer 3i was changed to 0.03 μm and 0.05 μm, respectively, and the thickness of crystalline i-type silicon-based photoelectric conversion layer 4i was changed to 0.4 μm and 0.7 μm, respectively. Table 2 also includes measured initial output properties of the mini-modules formed in examples 8 and 9.

Comparative Example 5

An integrated-type silicon hybrid solar battery according to comparative example 5 was similar to that of comparative example 1, except that amorphous i-type silicon-based photoelectric conversion layer 3i was replaced with an amorphous i-type silicon-germanium photoelectric conversion layer of 0.04 μm thickness, and the thickness of crystalline i-type silicon-based photoelectric conversion layer 4i was changed to 0.55 μm. Incidentally, the same plasma CVD conditions as those of example 7 were used for forming amorphous i-type silicon-germanium photoelectric conversion layer 3i. Table 2 also includes measured initial output properties of the mini-module formed in comparative example 5.

From comparison between example 7 and comparative example 5 in Table 2, it is found, similarly as in the comparison between example 1 and comparative example 1 in Table 1, that even if photoelectric conversion layers 3i, 4i are made significantly thinner than conventional, the integration can easily be achieved with significantly small current leakage, by using the structure in which n-type silicon oxide layer 3n included in amorphous silicon-based photoelectric conversion unit 3 and p-type silicon layer 4p included in crystalline silicon-based photoelectric conversion unit 4 make a junction. The results shown in examples 7-9 particularly indicate that, although the thickness of amorphous i-type silicon-germanium photoelectric conversion layer 3i is less than one-half of the thickness of amorphous i-type silicon photoelectric conversion layer 3i in example 1, the integration with small current leakage becomes possible.

Figure 4:
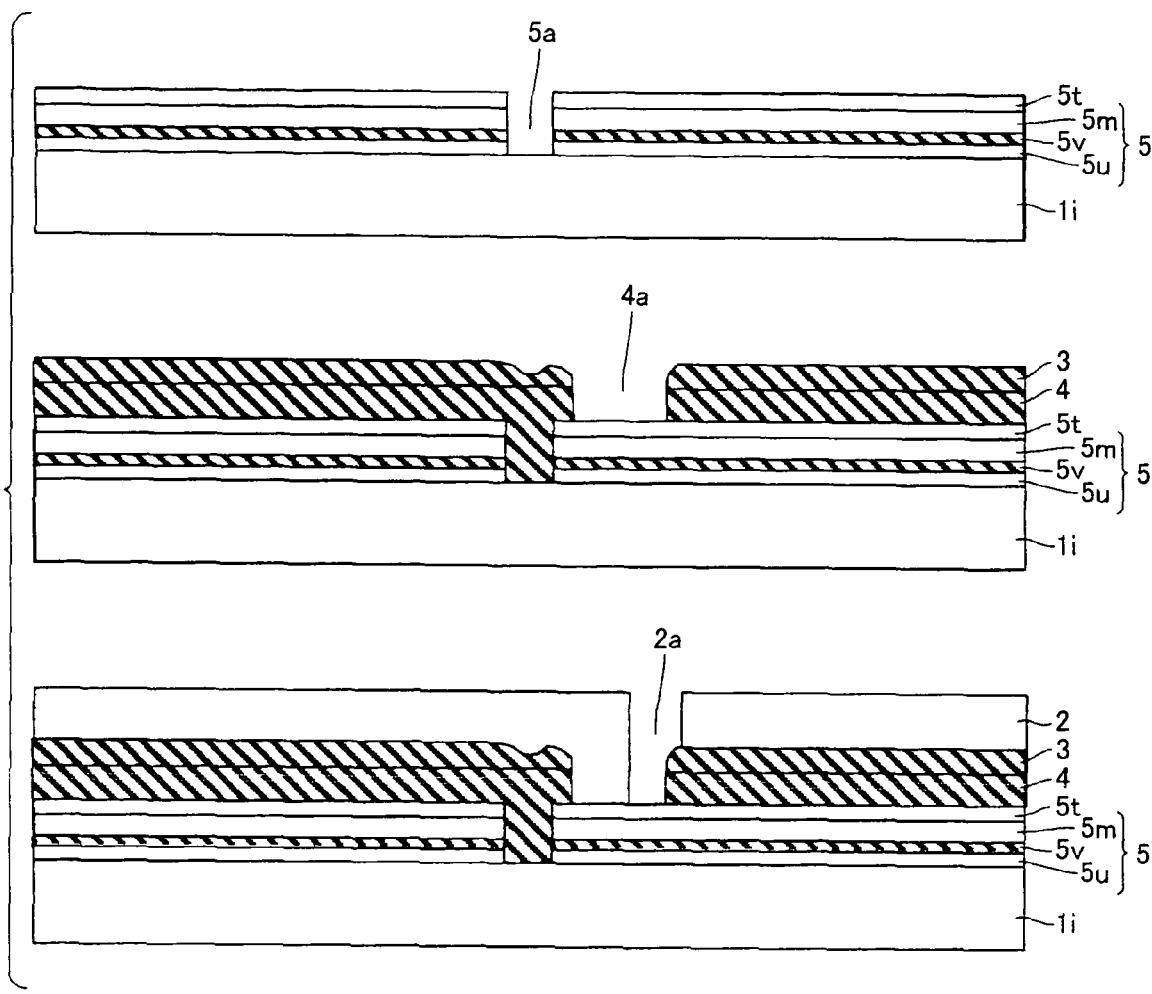
FIG. 4 is a schematic explanatory view that shows steps of making another integrated-type silicon hybrid solar battery according to the present invention.

In the following, examples 10-16 according to the present invention will be described in comparison with comparative examples 6-8 with reference to FIG. 4, as to a silicon-based integrated-type thin-film solar battery of a reverse type in which a crystalline silicon-based photoelectric conversion unit and an amorphous silicon-based photoelectric conversion unit were formed in this order on an insulating substrate.

Example 10

Initially, a polyethylene naphthalate (PEN) film having an area of 130 mm×130 mm and a thickness of 50 μm was used as transparent insulating substrate 1i. Transparent insulating substrate 1i was brought into intimate contact with a glass base plate having an area larger than the substrate 1i, and four corners thereof were fixed with a polyimide (PI) tape coated with a silicone-based adhesive. Subsequently, on the upper main surface of the substrate, a back underlayer 5u of ZnO having a thickness of 50 nm, a light-absorptive back layer 5v of silicon having a thickness of 90 nm, a metallic back layer 5m of Ag having a thickness of 200 nm, and a transmissive-reflective layer 5t of ZnO having a thickness of 60 nm were deposited by an RF sputtering method at a substrate temperature of 200° C. Incidentally, fine unevenness having a level difference of 0.03-0.06 μm was formed on a surface of the obtained metallic back layer 5m. Next, to divide back underlayer 5u, light-absorptive back layer 5v, metallic back layer 5m, and transmissive-reflective layer 5t (hereinafter collectively referred to as back electrode layer 5) into a plurality of band-like patterns, irradiation with YAG fundamental wave pulse laser was applied thereto through transparent insulating substrate 1i thereby forming isolation groove 5a of 50 μm width for back electrode layer 5, and then ultrasonic cleaning and drying were conducted.

Furthermore, transparent insulating substrate 1i having back electrode layer 5 formed thereon was introduced into a high-frequency plasma CVD apparatus to form crystalline silicon-based photoelectric conversion unit 4, whereby stacking an n-type crystalline silicon layer of 8 nm thickness (not shown), an n-type silicon oxide back reflective layer of 30 nm thickness (not shown), a crystalline i-type silicon-based photoelectric conversion layer of 0.4 μm thickness (not shown), and a p-type crystalline silicon layer of 15 nm thickness (not shown) in this order.

Next, to form amorphous silicon-based photoelectric conversion unit 3, the plasma CVD apparatus was successively used to stack an n-type silicon oxide layer of 10 nm thickness (not shown), an amorphous i-type silicon-based photoelectric conversion layer of 0.11 μm thickness (not shown), and an amorphous p-type silicon carbide (p-type a-SiC) layer of 10 nm thickness (not shown) in this order.

Subsequently, to divide amorphous silicon-based photoelectric conversion unit 3 and crystalline silicon-based photoelectric conversion unit 4 into a plurality of band-like patterns, the substrate was brought in the air, and irradiation with YAG second harmonic pulse laser was applied to transparent insulating substrate 1i from the photoelectric conversion unit side to thereby form connection groove 4a of 200 μm width.

Next, transparent conductive film 2 of ZnO having a thickness of 1.1 μm was formed by a thermal CVD method. Lastly, to divide transparent conductive film 2 into a plurality of band-like patterns, irradiation with YAG second harmonic pulse laser was applied to transparent insulating substrate 1i from the photoelectric conversion unit side by setting one of two internal walls in connection groove 4a farther from isolation groove 5a as the central position of irradiation. As a result, isolation groove 2a of 90 μm width for transparent conductive film 2 was formed thereby finishing an integrated-type silicon hybrid solar battery mini-module in which strip-like hybrid solar cells located adjacently in the lateral direction were electrically connected in series, similarly as shown in FIG. 2. The integrated-type silicon hybrid solar battery mini-module (hereinafter simply referred to as "mini-module") included 10 hybrid solar cells connected in series, each of which had a width of 10 mm and a length of 100 mm.

Leads for current extraction were connected to the outside of the integrated-type silicon hybrid solar battery of 100 mm×100 mm formed in example 10, and then the integrated-type silicon hybrid solar battery was sealed with a transparent organic protective layer of 125 mm×125 mm with a sealing resin layer of 120 mm×120 mm of EVA interposed therebetween (both layers were not shown). Subsequently, transparent insulating substrate 1i was cut from the transparent organic protective film side to achieve a substrate size of 120 mm×120 mm, and it was separated from the glass base thereby obtaining an integrated-type silicon hybrid solar battery module of a flexible type having an effective area of 100 mm×100 mm (hereinafter simply referred to as "mini-module"). The solar battery module obtained as such was irradiated with artificial sunlight having a spectrum approximated to air mass 1.5 and energy density of 100 mW/cm$^2$, under the condition that the temperature of the atmosphere and the solar battery was 25±1° C., to measure the current-voltage property of the solar battery module. Table 3 includes the measurement results of open-circuit voltage Voc per cell (i.e., obtained by dividing the measured open-circuit voltage by 10), short-circuit current density Jsc, fill factor FF, and conversion efficiency Eff.

Next, to measure properties of the above-described solar battery module after the light-induced degradation (after the stabilization), the module was irradiated with artificial sunlight having energy density of 500 mW/cm$^2$ for 20 hours under the condition that a surface temperature of the solar battery module was 50±2° C., and then further irradiated with artificial sunlight having energy density of 100 mW/cm$^2$ for 550 hours under the condition that a surface temperature of the back electrode of the mini-module was 50±2° C. Table 3 also includes mean values of Voc, Jsc, FF, and Eff of the solar battery module after the light irradiation (i.e., after the light-induced degradation or after the stabilization).

TABLE 3

| | thickness of amorphous i-type silicon photoelectric conversion layer (μm) | thickness of crystalline i-type silicon photoelectric conversion layer (μm) | thickness of n-type silicon oxide layer (nm) | condition for output measurement | Voc (V) | Jsc (mA/cm$^2$) | FF | Eff (%) |
|---|---|---|---|---|---|---|---|---|
| Example 10 | 0.11 | 0.4 | 10 | initial state | 1.37 | 9.62 | 0.72 | 9.48 |
| | | | | after stabilization | 1.36 | 9.55 | 0.68 | 8.85 |
| Example 11 | 0.09 | 0.3 | 10 | initial state | 1.35 | 8.92 | 0.70 | 8.47 |
| | | | | after stabilization | 1.35 | 8.85 | 0.67 | 8.07 |
| Example 12 | 0.07 | 0.3 | 10 | initial state | 1.35 | 8.66 | 0.70 | 8.20 |
| Example 13 | 0.15 | 0.7 | 10 | initial state | 1.34 | 10.56 | 0.72 | 10.10 |
| Example 14 | 0.11 | 0.4 | 7 | initial state | 1.36 | 9.53 | 0.72 | 9.39 |
| Example 15 | 0.11 | 0.4 | 17 | initial state | 1.37 | 9.15 | 0.74 | 9.26 |
| Example 16 | 0.11 | 0.4 | 20 | initial state | 1.37 | 8.84 | 0.74 | 9.01 |
| Comparative Example 6 | 0.11 | 0.4 | — | initial state | 1.30 | 9.36 | 0.59 | 7.15 |
| Comparative Example 7 | 0.15 | 0.7 | — | initial state | 1.33 | 10.29 | 0.66 | 9.03 |
| Comparative Example 8 | 0.31 | 1.3 | — | initial state | 1.35 | 11.47 | 0.72 | 11.14 |
| | | | | after stabilization | 1.34 | 10.96 | 0.63 | 9.30 |

Example 11

An integrated-type silicon hybrid solar battery according to example 11 of the present invention was similar to that of example 10, except that the thickness of amorphous i-type silicon-based photoelectric conversion layer 3i was changed to 0.09 μm, and the thickness of crystalline i-type silicon-based photoelectric conversion layer 4i was changed to 0.3 μm. Table 3 also includes the results of measured output properties in the initial state and after the stabilization of the mini-module formed in example 11.

Examples 12, 13

Integrated-type silicon hybrid solar batteries according to examples 12, 13 of the present invention were similar to that of example 10, except that the thickness of amorphous i-type silicon-based photoelectric conversion layer 3i and the thickness of crystalline i-type silicon-based photoelectric conversion layer 4i were changed. Table 3 also includes the results of measured output properties in the initial state of the mini-modules formed in examples 12, 13.

Examples 14-16

Integrated-type silicon hybrid solar batteries according to examples 14-16 of the present invention were similar to that of example 10, except that the thickness of the n-type silicon oxide layer was changed. Table 3 also includes the results of measured output properties in the initial state of the mini-modules formed in examples 14-16.

Comparative Example 6

An integrated-type silicon hybrid solar battery according to comparative example 6 was similar to that of example 10, except that a crystalline n-type silicon layer of 30 nm thickness was formed instead of the n-type silicon oxide layer. Table 3 also includes the results of measured output properties in the initial state of the mini-module formed in comparative example 6.

Comparative Example 7

An integrated-type silicon hybrid solar battery according to comparative example 7 was similar to that of example 13, except that a crystalline n-type silicon layer of 30 nm thickness was formed instead of the n-type silicon oxide layer. Table 3 also includes the results of measured output properties in the initial state of the mini-module fabricated in comparative example 7.

Comparative Example 8

An integrated-type silicon hybrid solar battery according to comparative example 8 was similar to that of comparative example 6, except that the thicknesses of amorphous i-type silicon-based photoelectric conversion layer 3i and crystalline i-type silicon-based photoelectric conversion layer 4i were changed. Table 3 also includes the results of measured output properties in the initial state and after the stabilization of the mini-module formed in comparative example 8.

From comparison between examples 10-13 and comparative examples 6-8, it is found that the formed integrated-type silicon hybrid solar battery of the so-called reverse type can also produce the effects similar to those of the normal type as shown previously. Moreover, from comparison between example 10 and examples 14-16, it is found that there is a preferable range for the thickness of the n-type silicon oxide layer. In examples 10 and 14, the spectral sensitivity integral current of the top cell limits the output current of the integrated-type silicon hybrid solar battery. In example 15, on the other hand, the effect of reflecting light toward the top cell side by the n-type silicon oxide layer becomes significant, so that the amount of light reaching the bottom cell side is decreased, and the output current of the integrated-type silicon hybrid solar battery is limited by the spectral sensitivity integral current of the bottom cell, causing decrease in the entire output current. Although the fill factor of the integrated-type silicon hybrid solar battery should usually be improved in a case like this, only a small improvement thereof is achieved in example 15 because the n-type silicon oxide layer has a thickness as large as 17 nm and its series resistivity loss is large. As a result, the conversion efficiency in example 15 is lowered as compared with example 10. It is found that if the n-type silicon oxide layer is set to a larger thickness such as 20 nm as in example 16, the fill factor is no longer improved in spite of decrease of the entire output current.

Incidentally, the reverse type often uses a flexible substrate as used in the above examples. In that case, it goes without saying that the smaller thickness of each of the amorphous i-type silicon-based photoelectric conversion layer and the crystalline i-type silicon-based photoelectric conversion layer causes the smaller residual stress to the substrate, and hence leads to suppression of warpage of the substrate.

In the above-described examples, there has only been described the silicon hybrid solar battery in which one amorphous silicon-based photoelectric conversion unit and one crystalline silicon-based photoelectric conversion unit are stacked. However, two or more amorphous silicon-based photoelectric conversion units may be included, and two or more crystalline silicon-based photoelectric conversion units may be included. Furthermore, a band-gap-adjusting element such as carbon or germanium may also be added to silicon.

Incidentally, the present application is a patent application which corresponds to a "sponsored project for research and development of photovoltaic power generation technology" of fiscal 2004 by Independent Administrative Institution of New Energy and Industrial Technology Development Organization, and to which Article 30 of the Law on Special Measures for Industrial Revitalization is applied.

INDUSTRIAL APPLICABILITY

As described above, according to the present invention, it is possible to provide a stacked-type thin-film photoelectric conversion device having high photostability with a significantly high yield rate, while remarkably reducing production costs of the entire stacked-type thin-film photoelectric conversion device.

The invention claimed is:

1. A stacked-type photoelectric conversion device comprising an amorphous silicon-based photoelectric conversion unit and a crystalline silicon-based photoelectric conversion unit stacked thereon or vice versa, wherein
   an amorphous photoelectric conversion layer included in said amorphous photoelectric conversion unit has a thickness of at least 0.03 μm and less than 0.17 μm, and a crystalline photoelectric conversion layer included in said crystalline photoelectric conversion unit has a thickness of at least 0.2 μm and not more than 0.7 μm, and
   a silicon oxide layer of a first conductivity type included in said amorphous photoelectric conversion unit and a silicon layer of a second conductivity type included in said crystalline photoelectric conversion unit makes a junction, the silicon oxide layer having an oxygen content of at least 35 atomic %,
   wherein said silicon oxide layer of the first conductivity type has a thickness of at least 5 nm and less than 20 nm,
   wherein a transparent electrode layer, said amorphous photoelectric conversion unit, and said crystalline photoelectric conversion unit stacked in this order on a transparent insulating substrate are separated by a plurality of parallel linear isolation grooves so as to form a plurality of strip-like stacked-type photoelectric conversion cells, and the plurality of cells are electrically connected and integrated in series via a plurality of connection grooves extending in parallel with said isolation grooves.

2. The stacked-type photoelectric conversion device according to claim 1, wherein said amorphous photoelectric conversion layer is made of silicon-germanium.

3. The stacked-type photoelectric conversion device according to claim 1, wherein said crystalline photoelectric conversion unit further includes a silicon oxide layer of the first conductivity type on a side of said crystalline photoelectric conversion layer farther from said amorphous photoelectric conversion unit.

4. A stacked-type photoelectric conversion device comprising an amorphous silicon-based photoelectric conversion unit and a crystalline silicon-based photoelectric conversion unit stacked thereon or vice versa, wherein
   an amorphous photoelectric conversion layer included in said amorphous photoelectric conversion unit has a thickness of at least 0.03 μm and less than 0.17 μm, and a crystalline photoelectric conversion layer included in said crystalline photoelectric conversion unit has a thickness of at least 0.2 μm and not more than 0.7 μm, and
   a silicon oxide layer of a first conductivity type included in said amorphous photoelectric conversion unit and a silicon layer of a second conductivity type included in said crystalline photoelectric conversion unit makes a junction, the silicon oxide layer having an oxygen content of at least 35 atomic %, wherein said silicon oxide layer of the first conductivity type has a thickness of at least 5 nm and less than 20 nm, wherein said crystalline photoelectric conversion unit, said amorphous photoelectric conversion unit, and a transparent electrode layer stacked in this order on an insulating substrate are separated by a plurality of parallel linear isolation grooves so as to form a plurality of strip-like stacked-type photoelectric conversion cells, and the plurality of cells are electrically connected and integrated in series via a plurality of connection grooves extending in parallel with said isolation grooves.

5. The stacked-type photoelectric conversion device according to claim 4, wherein said amorphous photoelectric conversion layer is made of silicon-germanium.

6. The stacked-type photoelectric conversion device according to claim 4, wherein said crystalline photoelectric conversion unit further includes a silicon oxide layer of the first conductivity type on a side of said crystalline photoelectric conversion layer farther from said amorphous photoelectric conversion unit.

7. The stacked-type photoelectric conversion device according to claim 4, wherein the silicon oxide layer has electrical conductivity of approximately $10^{-9}$ to $10^{-6}$ S/cm.

8. The stacked-type photoelectric conversion device according to claim 1, wherein the silicon oxide layer has electrical conductivity of approximately $10^{-9}$ to $10^{-6}$ S/cm.

* * * * *